United States Patent
Wilk et al.

(10) Patent No.: US 6,730,977 B2
(45) Date of Patent: May 4, 2004

(54) LOWER TEMPERATURE METHOD FOR FORMING HIGH QUALITY SILICON-NITROGEN DIELECTRICS

(75) Inventors: Glen D. Wilk, Dallas, TX (US); John Mark Anthony, McKinney, TX (US); Yi Wei, Chandler, AZ (US); Robert M. Wallace, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/452,999

(22) Filed: Jun. 3, 2003

(65) Prior Publication Data

US 2003/0207590 A1 Nov. 6, 2003

Related U.S. Application Data

(62) Division of application No. 09/859,907, filed on May 17, 2001, now Pat. No. 6,613,698, which is a continuation of application No. 09/149,427, filed on Sep. 8, 1998, now Pat. No. 6,274,510.
(60) Provisional application No. 60/092,911, filed on Jul. 15, 1998.

(51) Int. Cl.$^7$ .............................................. H01L 29/76
(52) U.S. Cl. ...................................... 257/410; 257/327
(58) Field of Search ................................. 257/410, 327

(56) References Cited

U.S. PATENT DOCUMENTS

| | | |
|---|---|---|
| 3,629,088 A | 12/1971 | Frank et al. |
| 4,277,320 A | 7/1981 | Beguwala et al. |
| 4,300,989 A | 11/1981 | Chang |
| 4,636,400 A | 1/1987 | Nishioka et al. |
| 4,715,937 A | 12/1987 | Moslehi et al. |
| 4,917,843 A | 4/1990 | Gyarmati et al. |
| 5,376,593 A | 12/1994 | Sandhu et al. |
| 5,445,999 A | 8/1995 | Thakur et al. |
| 5,618,755 A | 4/1997 | Ito |
| 5,747,357 A | 5/1998 | Su |
| 5,907,792 A | 5/1999 | Droopad et al. |
| 5,913,149 A | 6/1999 | Thakur et al. |
| 5,989,338 A | 11/1999 | DeBoer et al. |
| 6,020,247 A | 2/2000 | Wilk et al. |
| 6,077,754 A | 6/2000 | Srinivasan et al. |
| 6,087,229 A | 7/2000 | Aronowitz et al. |
| 6,127,287 A | 10/2000 | Hurley et al. |
| 6,136,388 A | 10/2000 | Raoux et al. |
| 6,274,510 B1 | 8/2001 | Wilk et al. |
| 6,613,698 B2 * | 9/2003 | Wilk et al. .................. 438/775 |

OTHER PUBLICATIONS

R. Gereth and W. Scherber, "Properties of Ammonia–Free Nitrogen– Si $_3$N$_4$ Films Produced at Low Temperatures," *J. Electrochem. Soc.: Solid State Science and Technology*, vol. 119, No. 9, pp. 1248–1254, Sep. 1972.

Mehrdad M. Moslehi and Krishna C. Saraswat, "Thermal Nitridation of Si and SiO$_2$ for VLSI," *IEEE Transactions on Electron Devices*, vol. Ed–32, No. 2, pp. 106–123, Feb. 1985.

X. Qiu and E. Gyarmati, "Composition and Properties of SiN$_x$ Films Produced by Reactive R.F. Magnetron Sputtering," *Thin Solid Films, 151*, pp. 223–233, Mar. 1987.

Application No. 09/176,422 filed Oct. 21, 1998.

Application Ser. No. 09/149,427, filed Sep. 8, 1998.

* cited by examiner

*Primary Examiner*—Mark V. Prenty
(74) *Attorney, Agent, or Firm*—David Denker; Wade James Brady, III; Frederick J. Telecky Jr.

(57) ABSTRACT

A method for forming a thermal silicon nitride on a semiconductor substrate is disclosed. This method allows formation of thermal silicon nitride that is thick enough for a FET gate dielectric, but has a low thermal budget.

1 Claim, 1 Drawing Sheet

LOWER TEMPERATURE METHOD FOR FORMING HIGH QUALITY SILICON-NITROGEN DIELECTRICS

This application is a divisional of application Ser. No. 09/859,907, filed May 17, 2001, now U.S. Pat. No. 6,613,698, which is a continuation of application Ser. No. 09/149,427, filed Sep. 8, 1998, now U.S. Pat. No. 6,274,510, which claims priority from application No. 60/092,911, filed Jul. 15, 1998.

FIELD OF THE INVENTION

This invention pertains generally to the formation of silicon-nitrogen compounds in integrated circuits, and more particularly to a lower temperature process for forming thick, thermally grown, silicon-nitrogen dielectrics.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits that can accomplish more functions in less time in a smaller package while consuming less power.

Most semiconductor memories use an array of tiny capacitors to store data. One approach to expanding the capacity of a memory chip is to shrink the area of each capacitor. However, everything else being equal, a smaller area capacitor stores less charge; thereby making it more difficult to integrate into a useful memory device. One approach to shrinking the capacitor area is to change to a storage dielectric material with a higher permittivity. Silicon nitride is one material that has a higher permittivity than the most conventional dielectric, silicon dioxide.

In another, related area, one concern is the thickness of the gate dielectric used in conventional CMOS circuits. The current drive in a CMOS transistor is directly proportional to the gate capacitance. Since capacitance scales inversely with thickness, higher current drive requires continual reductions in thickness for conventional dielectrics. Present technology uses $SiO_2$ based films with thicknesses near 5 nm. However projections suggest the need for 2 nm films for future small geometry devices. $SiO_2$ gate dielectrics in this thickness regime pose considerable challenges from a manufacturing perspective. In general, the increase in capacitance density (C/A) required for increasing current drive can be accomplished either by decreasing the dielectric thickness t or by increasing the dielectric permittivity $\epsilon$ of the material. Thus, as with storage dielectrics, it is again desirable to change to a material with a higher permittivity, such as silicon nitride. Due to its permittivity, a 3.6 nm silicon nitride film can provide the same capacitance density as a 2 nm $SiO_2$ film, while a 9 nm nitride film provides an equivalent oxide thickness of about 5 nm.

Another reason for using silicon nitride as a gate dielectric is its effectiveness as a diffusion barrier for boron and other dopant species. This barrier property allows a silicon nitride gate dielectric to limit dopant depletion from polysilicon gates.

Integrated circuit manufacturers have used chemically-vapor deposited (CVD) silicon nitride as oxidation and diffusion masks for years. However, CVD (or deposited) silicon nitride typically does not have good enough electrical properties, such as breakdown voltage, for use as a gate or memory dielectric.

An alternate approach for forming silicon nitride is direct nitridation of a silicon surface. This process forms a compound often referred to as thermally grown or thermal silicon nitride. In general, thermal silicon nitrides often have electrical properties that are better than typical deposited nitrides. This difference is especially significant, when comparing nitrides formed with repeatable processes used in high volume production.

Until now, the processes for forming silicon nitride have not been suitable for forming thick, thermally grown, silicon nitride layers in production micron and submicron circuits. U.S. Pat. No. 4,277,320 to Beguwala, et al. describes some shortcomings of using earlier silicon nitride methods to form gate dielectrics. However, the '320 patent describes a method that uses a 975 degree C. substrate to form a thermal silicon nitride.

SUMMARY OF THE INVENTION

We have known that we could form a very thin, high quality, thermal silicon nitride film by exposing a clean silicon substrate to a reactive nitrogen atmosphere at temperatures above 426 degrees C. However, this process yields films that have a self-limiting thickness of about 5 Å at 426 degrees C. Raising the substrate temperature increases this thickness somewhat, but the self-limiting thickness is still about 15 Å at 800 degrees C. In fact, some artisans have taught that high quality, thermal nitride films, with a thickness of 4.5 Å, typically required temperatures near 1150 degrees C. Since most micron and submicron integrated circuits have limited thermal budgets, it is desirable to avoid steps that require high temperatures. Thus, we developed a method to form useful thicknesses of silicon nitride at temperatures below 900 degrees C., which can also be practiced below 900, 800, or even 500 degrees C.

A method for forming a thermal silicon nitride on a semiconductor substrate is disclosed. This method includes providing a partially completed integrated circuit with an exposed silicon surface; exposing the silicon surface to a first atmosphere including nitrogen, wherein the integrated circuit surface first temperature is between 426 and 700 degrees C., thereby forming an original layer of thermal silicon nitride, the silicon nitride layer'thickness substantially determined by the silicon surface'temperature; determining a planned integrated circuit surface temperature for a second silicon nitride layer formation, the planned temperature between 426 and 700 degrees C., thereby substantially determining the second silicon nitride layer'potential thickness; depositing a layer of silicon on the original layer of silicon nitride to form a second silicon layer, the second silicon layer having a thickness no greater than the second silicon nitride layer'potential thickness; exposing the second silicon layer to a second atmosphere including nitrogen, wherein the integrated circuit surface second temperature is the planned temperature, thereby forming a second layer of thermal silicon nitride extending to the original layer of thermal silicon nitride and creating a combined layer of thermal silicon nitride. In some embodiments, wherein the first and second atmospheres include ammonia. In some embodiments, the first temperature is below 600 degrees C., and may be above 500 degrees C.

In another method, the method includes providing a semiconductor substrate with an exposed silicon surface, wherein the semiconductor substrate temperature is between 426° C. and 900° C.; exposing the silicon surface to a first atmosphere including a nitrogen source and a silicon source, under conditions where reactions in the atmosphere are generally avoided; wherein the silicon source deposits silicon on the exposed surface at a silicon growth rate and the nitrogen source reacts with the silicon on the integrated circuit surface to form thermal silicon nitride, wherein the silicon nitride reaction rate is limited by the availability of unreacted silicon on the exposed surface. In this method, two potential nitrogen sources are atomic nitrogen and ammonia. In some embodiments, the pressure of the first atmosphere is less than $10^{-6}$ Torr, and may be above $10^{-9}$ Torr.

DETAILED DESCRIPTION

Figure 1A:
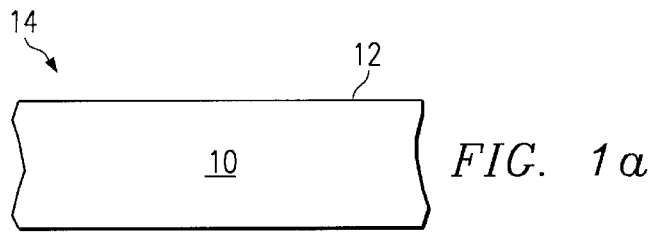
FIGS. 1A–1D show a low temperature method for forming a high quality silicon-nitrogen dielectric.
Figure 1B:
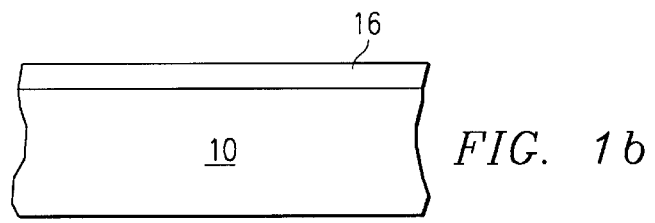
Figure 1C:
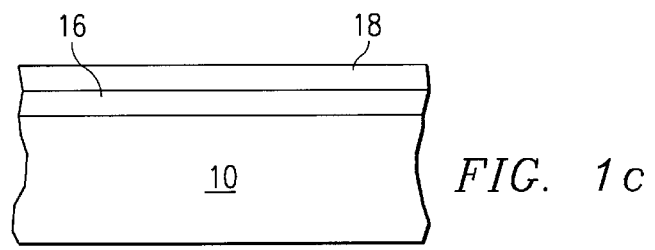
Figure 1D:
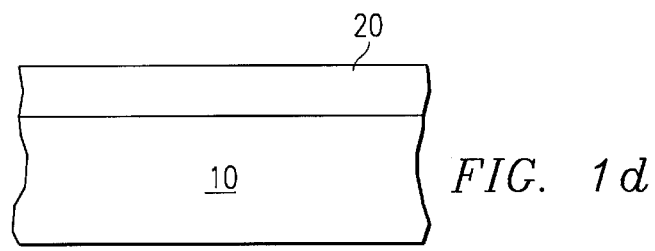
Figure 2:
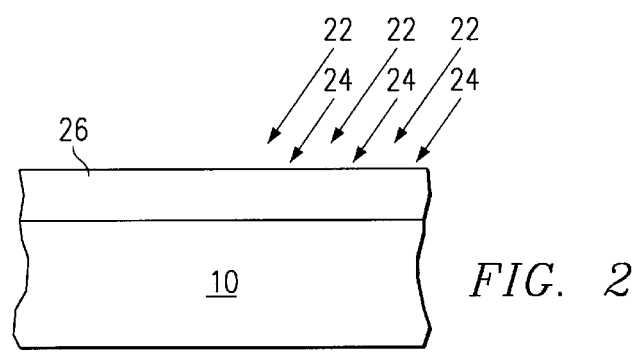
FIG. 2 shows a low temperature method for forming a high quality silicon-nitrogen dielectric.

FIG. 1 outlines a low temperature method of using this invention to form a high quality silicon-nitrogen dielectric. Initially, Si substrate 10 with a first face containing a clean silicon surface 12 is provided. Typically, this substrate 10 will have at least part of the surface 12 being either bare or hydrogen passivated silicon. In addition to the clean silicon surface 12, the first face may also have other features of a partially completed integrated circuit, such as field oxide regions, already formed upon it, and typically has other structures, such as diffusion or implant regions formed in the substrate beneath it. In many devices, these other structures have a limited thermal budget, which limits the amount of high temperature processing that can be applied to the wafer during later steps. As time progresses, and device sizes shrink, these thermal budgets also shrink. One of these limited thermal budget devices is a field-effect transistor, with a source-to-drain (channel length) spacing less than 13 nm. These fine pitch (by today's standards) devices could not be repeatably fabricated with 30 angstrom thick silicon nitride gate dielectrics formed with previous thermal nitride processes. The low temperature method described below allows forming transistors with usefully thick gate dielectrics, even with the thermal, budgets predicted for 8 and 10 nm channel length devices.

In one embodiment, the surface 12 is a Si (100) surface. When ammonia 14 is applied to the surface, the ammonia decomposes into $NH_2$ and H on the surface, even at temperatures down to 120K. At substrate temperatures above 377 degrees C., some of the $NH_2$ and H recombine to form volatile ammonia gas, while the major reaction channel is further decomposition of the $NH_2$ to form a Si—N species and hydrogen. At substrate temperatures above approximately 426 degrees C., the surface nitrogen begins to diffuse into the Si subsurface, thus forming a thermal silicon nitride thin film 16 with a low thermal budget.

This method provides satisfactory results with a wide range of ammonia 14 pressures, generally above $10^{-8}$ Torr. However, it may be preferable to use ammonia pressures between $10^{-6}$ and $10^{-3}$ Torr.

For substrate temperatures below 500 degrees C., some of this liberated hydrogen will passivate the surface. However, at approximately 500 degrees C., the hydrogen will desorb concomitantly (as $H_2$) with the formation of the nitride film 16. Thus, it is sometimes useful to form these thermal silicon nitride films at substrate temperatures between 500 and 600 degrees C., or even in some cases up to 700 degrees C. In one sample application of a transistor gate dielectric, the equivalent oxide thickness should be about 2.2 nm. This corresponds to a desired nitride thicknesses of about 4 nm. However, the nitride film thickness for the 426 degree C. method is only 0.5 nm, while the film thickness for the 700 degree C. method is 1 nm.

To provide a 4 nm layer, the method uses more steps as shown in FIG. 1, but still obtains a highly uniform, high electrical quality nitride layer. This thickening method involves first forming a highly uniform silicon nitride layer 16 on a silicon surface 12 as described above. Next, a uniform silicon layer 18 is deposited on the silicon nitride layer 16. This layer 18 must be thin enough to allow the nitrogen to diffuse through and react with the entire thickness. The thickness and uniformity of the final nitride layer will depend upon the thickness of the silicon layer 18. Thus, silicon layer 18 should be formed with a well-controlled method, such as sputtering, chemical vapor deposition or molecular beam epitaxy, or any well-controlled silicon deposition method. This new silicon surface is then exposed to another ammonia atmosphere 14, forming a single Si—N layer 20. In this step, the total thickness of nitride layer 20 is determined by the thickness of the silicon 18 and the underlying Si—N layer 16. If necessary, this silicon deposition and nitridation can be repeated to form thicker layers.

In another aspect of this invention, the silicon 22 and the nitrogen (e.g. $NH_3$) 24 can be deposited on the wafer simultaneously. In this method, the nitrogen reacts with the deposited silicon to form a silicon-nitride film 26. For wafer substrate temperatures around 500 degrees C., a silicon deposition rate from 1 to 5 angstroms per minute allows an 1 microTorr ammonia atmosphere to continuously form a high quality thermal nitride on the deposited silicon. At these rates, the silicon-nitride film 26 continually builds up as a solid layer, until shortly after the silicon deposition stops. Thus, standard silicon deposition controls allow control of the silicon-nitride film thickness. Preferably, the silicon deposition rate is limited to 1 to 2 angstroms per minute. This slow deposition rate not only provides better process control, but also minimizes hillocks in the resulting film.

Preferably, the reaction chamber pressure is maintained between about $10^{-6}$ and $10^{-9}$ Torr. At these pressures and silicon deposition rates, skilled artisans can ensure that the silicon and nitrogen do not have enough energy to react (in statistically significant quantities), until they reach the hot substrate surface.

In one useful variant of the methods above, the ammonia is replaced with an atomic nitrogen source. Atomic nitrogen provides comparable reactivity with the ammonia nitrogen source, but the nitrogen atoms/ions do not stick to the reaction chamber to the same degree as the ammonia. Skilled artisans understand that atomic nitrogen can be generated with RF coils or ion beam generators, as well as by other common methods.

For instance, nitrogen atoms or ions can be created from a remote source, such as from an ion accelerator, along with Si ions from the same source. The ion energies can be tuned such that they arrive at the surface simultaneously at low (<10 eV) energy. An electron cyclotron resonator (ECR) source can also be used to produce ionic nitrogen atoms which are co-deposited with Si atoms (deposited from an independent source, as mentioned above) on a substrate biased such that the ions have low (<10 eV) energy at the substrate.

We claim:

1. An integrated circuit comprising:
   a transistor, the transistor having a source, a drain, a channel region, and a gate dielectric;
   the source located within 13 nm of the drain; the gate dielectric formed from thermal silicon nitride, the gate dielectric having a thickness greater than 3 nm.

* * * * *